United States Patent
Larrey et al.

(10) Patent No.: US 9,029,178 B2
(45) Date of Patent: May 12, 2015

(54) METHOD FOR PRODUCING A DEVICE COMPRISING CAVITIES FORMED BETWEEN A SUSPENDED ELEMENT RESTING ON INSULATING PADS SEMI-BURIED IN A SUBSTRATE AND THIS SUBSTRATE

(71) Applicant: Commissariat a l'Energie Atomique et Aux Ene Alt, Paris (FR)

(72) Inventors: Vincent Larrey, La Murette (FR); Jean-Philippe Polizzi, Grenoble (FR)

(73) Assignee: Commissariat à l'énergie atomique et aux énergies alternatives, Paris (FR)

( * ) Notice: Subject to any disclaimer, the term of this patent is extended or adjusted under 35 U.S.C. 154(b) by 0 days.

(21) Appl. No.: 14/355,770

(22) PCT Filed: Nov. 8, 2012

(86) PCT No.: PCT/EP2012/072156
§ 371 (c)(1),
(2) Date: May 1, 2014

(87) PCT Pub. No.: WO2013/068474
PCT Pub. Date: May 16, 2013

(65) Prior Publication Data
US 2014/0295606 A1    Oct. 2, 2014

(30) Foreign Application Priority Data
Nov. 9, 2011    (FR) ...................................... 11 60208

(51) Int. Cl.
H01L 21/00    (2006.01)
B81C 1/00    (2006.01)
B06B 1/02    (2006.01)
G01D 5/02    (2006.01)

(52) U.S. Cl.
CPC ........... *B81C 1/00158* (2013.01); *B06B 1/0292* (2013.01); *B81C 1/00039* (2013.01); *B81B 2203/0307* (2013.01); *B81C 2201/01* (2013.01); *G01D 5/02* (2013.01)

(58) Field of Classification Search
None
See application file for complete search history.

(56) References Cited

U.S. PATENT DOCUMENTS

2007/0013269 A1*    1/2007    Huang ........................ 310/334
2008/0290756 A1    11/2008    Huang (Continued)

FOREIGN PATENT DOCUMENTS

WO    2006 134580    12/2006

OTHER PUBLICATIONS

French Search Report Issued in Application No. FR 1160208 issued Sep. 13, 2012 Filed Nov. 9, 2011.

(Continued)

*Primary Examiner* — Kyoung Lee
(74) *Attorney, Agent, or Firm* — Oblon, McClelland, Maier & Neustadt, L.L.P.

(57) ABSTRACT

A method for producing a device including plural cavities defined between a substrate in at least one given semiconductor material and a membrane resting on a top of insulating posts projecting from the substrate, the method allowing a height of the cavity or cavities to be adapted independently of a height of the insulating posts and allowing cavities of different heights to be formed.

14 Claims, 4 Drawing Sheets

(56) References Cited

U.S. PATENT DOCUMENTS

2009/0126183 A1 5/2009 Chang et al.
2009/0142872 A1 6/2009 Park et al.

OTHER PUBLICATIONS

International Search Report Issued Apr. 4, 2013 in PCT/EP12/072156 Filed Nov. 8, 2012.

* cited by examiner

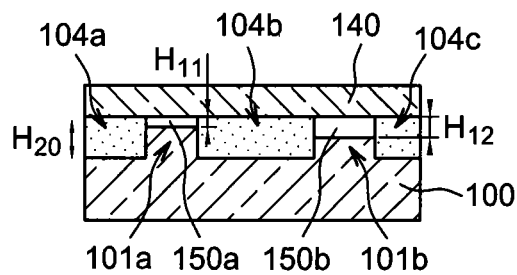
FIG. 2E
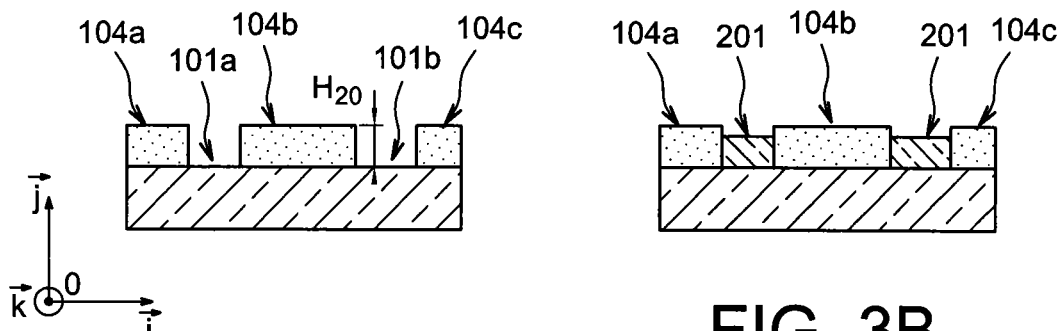
FIG. 3A
FIG. 3B
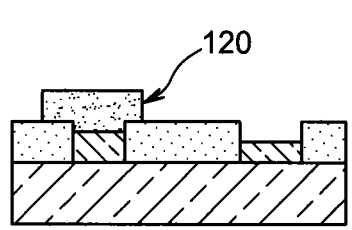
FIG. 3C
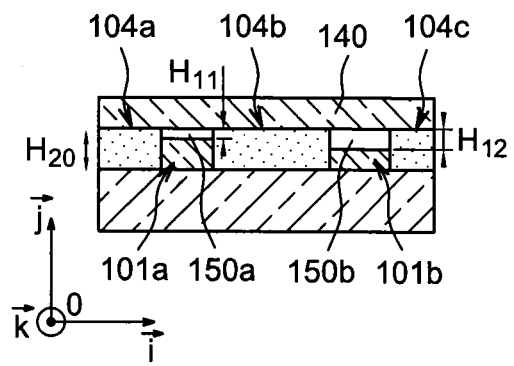
FIG. 3D

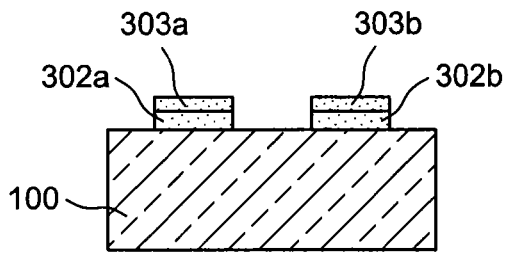
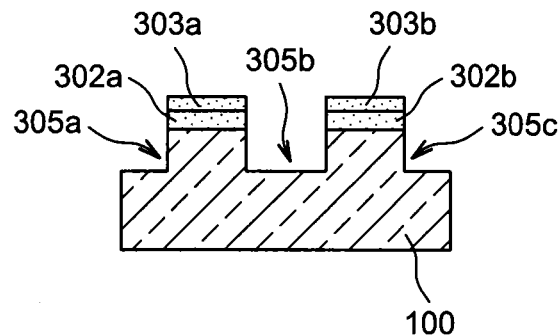
FIG. 4A            FIG. 4B
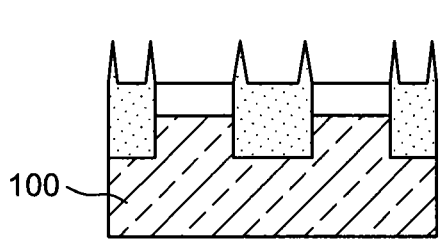
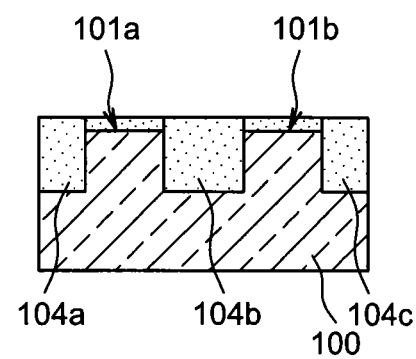
FIG. 4C            FIG. 4D
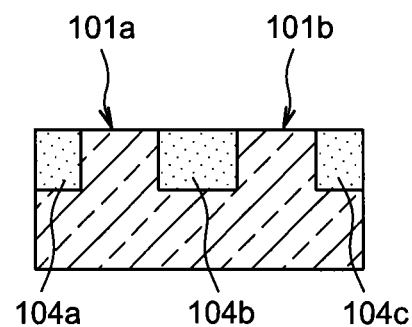
FIG. 4E

METHOD FOR PRODUCING A DEVICE COMPRISING CAVITIES FORMED BETWEEN A SUSPENDED ELEMENT RESTING ON INSULATING PADS SEMI-BURIED IN A SUBSTRATE AND THIS SUBSTRATE

TECHNICAL FIELD

The present invention relates to the field of nano- and micro-electronics and concerns an improved method for forming a device provided with one or more gaps or cavities formed between a suspended element such as a membrane or beam for example and a substrate, the suspended element being held above the substrate via insulating posts.

With the invention it is possible to produce a device in which the height of the cavity or cavities is adjusted independently of the height of the insulating posts.

The invention also allows a device to be obtained having cavities of different heights.

It finds particular applications in the fabrication of Nano Electro Mechanical Systems and Micro Electro Mechanical Systems (NEMS/MEMS) and notably of electro-acoustic transducers e.g. Capacitive Micromachined Ultrasonic Transducers (cMUTS).

PRIOR ART

A MEMS transducer is generally formed of a fixed part provided with an electrode which can be formed in a semiconductor substrate 10, and of a membrane 40 forming a mobile electrode.

The membrane 40 rests on insulating posts 14a, 14b and together with the fixed part forms a cavity 50 in which it is intended to vibrate.

In said transducer, movements of the membrane 40 created by acoustic waves translate as electric signals, whilst electric signals applied to the mobile electrode and fixed electrode can allow actuation of the membrane 40.

The height $H_1$ of the cavity 50 separating the substrate 10 from the membrane 40 is generally fixed by the height $H_2$ of the insulating posts 14a, 14b. To enable good insulation and to reduce phenomena of parasitic capacitance, it is preferable to form insulating posts of good height $H_2$.

At the same time, for reasons of efficient functioning and for some applications, it is also preferable to form cavities of low height $H_1$. With low cavity height it is possible to cause actuation of the membrane 40 with low control voltages and to obtain a better signal when the device is in detection mode.

Document US 2009/0142872 describes a method for producing a cMUT transducer in which the insulating posts intended to support the membrane are formed by oxidizing the semiconductor substrate.

Said method can allow insulating posts to be formed which are partly buried in the substrate. It is therefore possible to form insulating posts of good height whilst limiting the height of the cavity. However, with said method the height of the cavity remains dependent upon the height of the insulating posts.

Document WO 2006/134580 A2 presents a method for forming a MEMS transducer in which the insulating posts are arranged at different depths of the outer surface of a substrate, a membrane being attached to some of these posts.

With said method the height of the cavities also remains dependent upon the height of the insulating posts.

The problem arises of finding a novel method which does not have the above-mentioned drawbacks, which allows a MEMS device to be obtained having insulating posts of good height whilst maintaining a cavity of low height.

The problem also arises of finding a novel method with which to obtain cavities of different heights.

DESCRIPTION OF THE INVENTION

The present invention provides a method for forming a device comprising one or more gaps such as cavities defined between a substrate in at least one given semiconductor material and a suspended element resting on the top of insulating posts projecting from the substrate, the method comprising steps of:

a) forming insulating posts either side of one or more regions of an upper surface of a substrate in at least one given semiconductor material;

b) modifying, via at least one etching and/or at least one addition of material, the distance between at least one given region from among the said regions of the said upper surface and the top of the insulating posts located either side of the said given region, the said insulating posts after step b) comprising at least one part located in the substrate and surrounded by the said given semiconductor material;

c) forming the suspended element on the top of said insulating posts.

At step b), the added material is semiconductive.

With said method, first the height is fixed of the insulating posts which are partly buried or inserted in the substrate, after which the height is fixed of one or more cavities formed between the suspended element and the substrate, by adding or removing material from the substrate after forming the posts.

It is therefore possible to obtain a device having cavities of low height e.g. between 10 nm and 5 μm, whilst maintaining a good thickness of the insulating posts e.g. between 0.1 μm and 10 μm.

At step b), the method may comprise at least one etching of said given region through a mask protecting at least one other region from among said regions of the upper surface of the substrate.

According to one variant, step b) may comprise epitaxial growth of semiconductor material on at least the said given region of the upper surface of the substrate.

The present invention also provides a method for forming a device comprising several gaps such as cavities defined between a substrate in at least one given semiconductor material and a suspended element resting on the top of insulating posts projecting from the substrate, the method comprising steps of:

a) forming insulating posts either side of one or more regions of an upper surface of a substrate in at least one given semiconductor material;

b) modifying, via at last one etching and/or addition of semiconductor material, the distance between at least one given region from among the said regions of said upper surface and the top of insulating posts positioned either side of said given region, a mask protecting at least one other region from among said regions of the upper surface of the substrate, the said insulating posts after step b) comprising at least one part positioned in the substrate and surrounded by said given semiconductor material;

c) forming the suspended element on the top of said insulating posts.

In this manner, cavities of different heights are formed between the substrate and the membrane.

Step c) to form the suspended element may comprise the transfer by direct bonding of the membrane onto the posts.

The membrane can subsequently be thinned after transfer.

The substrate may form a first electrode or comprise a first electrode e.g. an actuating and/or measuring electrode.

The suspended element e.g. a beam or membrane may form a second electrode or comprise a second electrode e.g. an actuating and/or measuring electrode.

According to one possible embodiment, the insulating posts may be formed in a given material which is not necessarily insulating, and of a top part in an insulating material allowing the substrate to be electrically insulated from the suspended element.

According to one possibility, the present invention may be applied to the production of a MEMS or NEMS.

The present invention may also be applied in particular to the fabrication of a cMUT transducer.

The said given region may be surrounded by one insulating post or several insulating posts contiguous with this region.

According to one particular embodiment, the said given region may be fully surrounded by one or more said insulating posts.

According to one possible embodiment, the said posts may be regularly distributed in an array.

The method at step a) may comprise steps of:
etching the upper surface of the substrate so as to form semiconductor blocks;
forming insulating posts either side of said semiconductor blocks.

According to a first possible embodiment, the forming of said insulating posts may comprise steps of:
conformal depositing of insulating material on and around said semiconductor blocks;
removing insulating material in a region located above the semiconductor blocks.

The height of the insulating posts is thus fixed in relation to the height of the semiconductor blocks.

According to a second possible embodiment, the forming of said insulating posts may comprise steps of:
etching the upper surface of the substrate so as to form semiconductor blocks, the semiconductor blocks being covered by an oxidizing mask;
oxidizing the given semiconductor material of the substrate.

According to another possibility, the forming of said insulating posts comprises the etching of an insulating layer resting on the substrate, so as to define insulating posts resting on the substrate.

BRIEF DESCRIPTION OF THE DRAWINGS

The present invention will be better understood on reading the description of examples of embodiment given solely by way of indication and in no way limiting, with reference to the appended drawings in which:

FIGS. 2A-2E illustrate a first example of a method according to the invention for fabricating a device provided with several closed cavities between a membrane and a substrate;

FIGS. 3A-3D and 6A-6B illustrate a second example of a method according to the invention to produce a device provided with several closed cavities between a membrane and a substrate;

FIGS. 4A-4E illustrate a third example of a method according to the invention for producing a device provided with several closed cavities between a membrane and a substrate;

DETAILED DESCRIPTION OF PARTICULAR EMBODIMENTS

A first example of a method according to the invention will now be described in connection with FIGS. 2A-2E.

The starting material of this method is a substrate 100 which may be in semiconductor material e.g. Si, and comprises regions 101a, 101b in the form of blocks created on a surface called the <<upper surface>> of the substrate 100.

The substrate 100 may be intended to form an electrode or to comprise a region intended to form an electrode, in particular if the device produced is a MEMS or NEMS, and more particularly a cMUT transducer.

These blocks may have been formed by etching the upper surface of the substrate 100, for example anisotropic etching through a mask.

Etching may be conducted for example using so-called <<dry>> etching by Reactive Ion Etch (RIE) or Deep Reactive Ion Etch (DRIE), or using so-called <<wet>> etching via chemical route using reagents such as KOH or TMAH for example.

An insulating layer 102 is then formed on the substrate 100. This insulating layer 102 may be in $SiO_2$ for example and formed by conformal deposition so that it reproduces the relief of the upper surface of the substrate 100.

Figure 1:
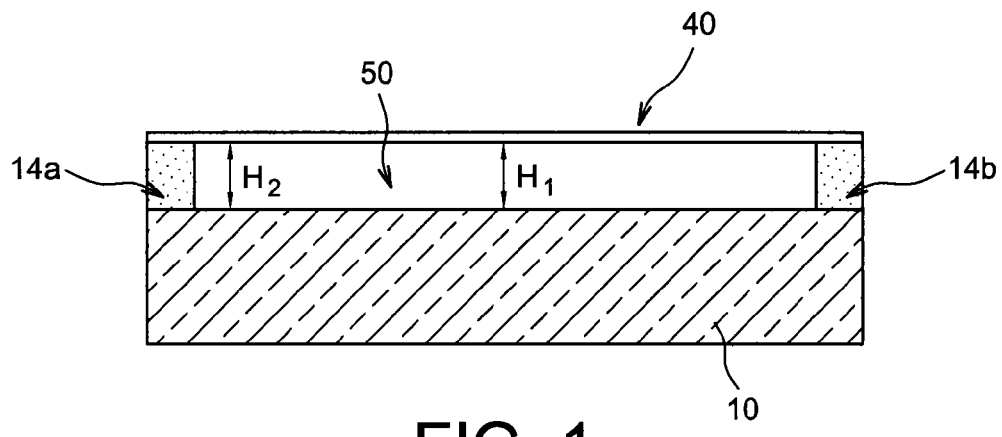
FIG. 1 illustrates an example of a prior art cMUT transducer comprising a cavity formed between a membrane and a substrate.
Figures 2A, 2B:
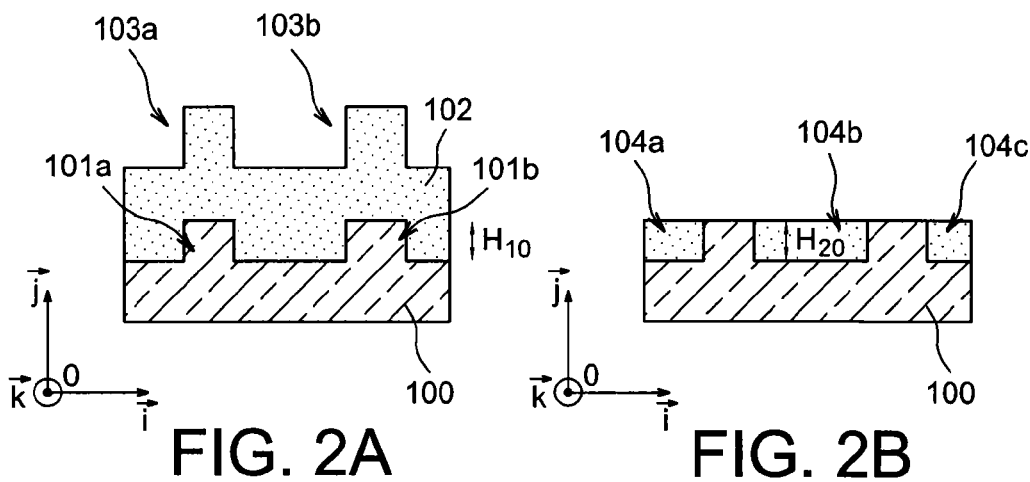

The formed insulating layer 102 may therefore comprise regions 103a, 103b forming blocks reproducing the shape of the semiconductor blocks 101a, 101b on the surface of the substrate 100 (FIG. 2A).

A planarization step is subsequently conducted of the regions 103a, 103b of the insulating layer 102 e.g. by polishing of Chemical Mechanical Planarization type (CMP) or by etching. The surface of the insulating layer 102 is thus made planar or substantially planar. The thickness of the insulating layer 102 projecting beyond the top of the regions 101a, 101b may also be removed. In this manner insulating posts 104a, 104b, 104c are formed, derived from the insulating layer 102 and which may have a height $H_{20}$ measured in a direction parallel to the vector $\vec{j}$ of the orthogonal reference [O; $\vec{i}$; $\vec{j}$; $\vec{k}$] given in FIG. 2B) equal to the height $H_{10}$ of the semiconductive regions 101a, 101b. The height $H_{20}$ of the insulating posts may be between 0.1 μm and 10 μm for example.

The insulating posts 104a, 104b, 104c may therefore be formed so that they are buried in the substrate 100. The insulating posts 104a, 104b, 104c, may be entirely positioned within the substrate 100, the top of the insulating posts 104a, 104b, 104c and the upper surface of the substrate 100 lying at the same height. The sidewalls of the insulating posts 104a, 104b, 104c are therefore surrounded by the semiconductor material of the substrate 100.

A thickness of the upper surface of the substrate 100 is then removed, for example by plasma etching of the substrate.

This etching is performed so as to expose part of the sidewalls of the insulating posts 104a, 104b, 104c.

Figures 2C, 2D:
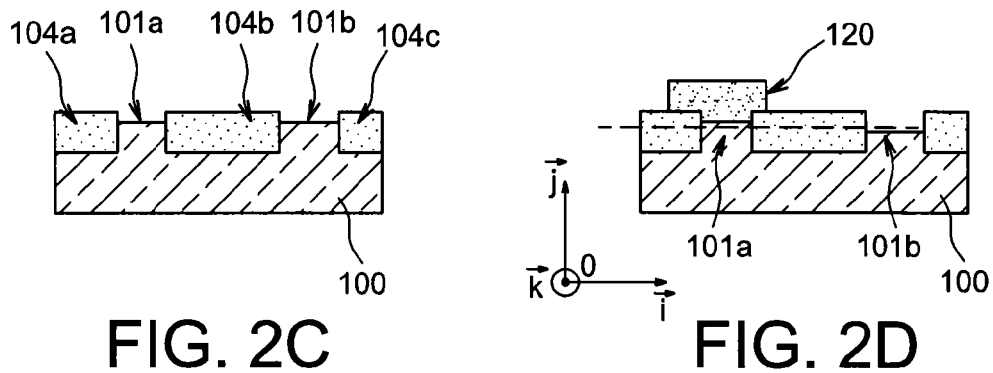

The lower part of the insulating posts 104a, 104b, 104c is thereby surrounded by the semiconductor material of the substrate 100 whilst an upper part of the posts is exposed and projects beyond the upper surface of the substrate 100 (FIG. 2C).

It is then possible to etch at least one given region 101b from among the said semiconductive regions 101a, 101b of the upper surface of the substrate 100 which are exposed. This etching is performed through a mask 120 protecting at least one other region 101a from among the said semiconductor regions 101a, 101b. A thickness of the given region 101b not protected by the mask 120 is therefore removed from the substrate 100 (FIG. 2D).

These removal steps can be performed using etching that is selective for the material of the insulating layer 102. This selective etching can be performed for example via plasma route of RIE or DRIE type when the regions 101a, 101b of the substrate 100 are in Si and the insulating layer 102 is in $SiO_2$.

By means of this etching the distance is adjusted between the top of the insulating posts 104b, 104c and the given region(s) 101a and 101b. It is therefore possible to adjust the height of a cavity or portion of cavity intended to be subsequently formed between these given regions of the upper surface of the substrate and a membrane resting on the top of the insulating posts 104.

This step to adjust the height of the top of the posts 104a, 104b, 104c in relation to the upper surface of the substrate 100 can be conducted by means of several successive etchings if several cavity heights are desired.

As a variant, this adjustment can be obtained by selective epitaxy i.e. epitaxy on region 101b through a mask 120 protecting at least one other region 101a from among the said semiconductor regions 101a, 101b.

A suspended element can then be formed e.g. a membrane 140. The membrane 140 may be in monocrystalline silicon for example resting on the insulating posts 104a, 104b, 104c. The membrane 140 may be intended to form an electrode or comprises a region intended to form an electrode. This membrane 140 may be formed by transfer onto the posts 104a, 104b, 104c, for example by direct bonding onto the latter.

A step to thin the membrane 140 can then be carried out. This thinning may use one of more of the following techniques either alone or in combination: chemical etching and/or dry etching and/or grinding and/or chemical mechanical polishing (CMP).

Between this membrane 140 resting on the insulating posts 104a, 104b, 104c, and the substrate 100, one or more closed cavities 150a, 150b can be formed.

A first gap, in this example a first cavity 150a or portion of cavity 150a can be defined between a first region 101a of the substrate 100 and the membrane 140, and between the insulating posts 104a, 104b. This first cavity 150a or portion of cavity 150a may have a height $H_{11}$ of between 10 nm and 5 μm for example, or in the order of 100 nm for example.

According to one possible embodiment, this first cavity 150a may optionally be closed so that it does not communicate with the outside or with another cavity.

A second gap, in this example a second cavity 150b or portion of cavity 150b defined between the given region 101b of the substrate 100 and the membrane 140 and between the insulating posts 104b, 104c may also be formed. This second cavity 150b or portion of cavity 150b may have a second height $H_{12}$ different from the first height $H_{11}$, and of between 50 nm and 5 μm for example, or in the order of several hundred nanometers for example. According to one possible embodiment, this second cavity 150b may optionally be closed so that it does not communicate with the outside or with another cavity (FIG. 2E).

A further example of the method of the invention is illustrated in FIGS. 3A-3D.

The starting material of this method is a substrate 100 coated with an insulating layer 102 in which separate posts 104a, 104b, 104c of height $H_{20}$, are formed e.g. by etching. The insulating layer 102 may be in $SiO_2$ for example or a <<low-k>> dielectric material such as SiOC (FIG. 3A). The height $H_{20}$ of the posts 104a, 104b, 104c (measured in a direction parallel to the vector $\vec{j}$ of the orthogonal reference $[O; \vec{i}; \vec{j}; \vec{k}]$ given in FIG. 3A) may be between 0.1 μm and 10 μm for example.

Regions 101a, 101b of a surface of the substrate 100 called <<upper surface>> which are located between the insulating posts 104a, 104b, 104c are thus exposed.

An additional thickness of semiconductor material 201 is then formed on these regions 101a, 101b via selective epitaxial growth.

In this manner the distance between the top of the insulating posts 104a, 104b, 104c and the regions 101a, 101b of the upper surface of the substrate 100 can be adjusted (FIG. 3B).

Etching can subsequently be performed on at least one given region 101b from among the said semiconductor regions 101a, 101b. This etching can be conducted using dry etching of RIE or DRIE type for example through a mask 120 protecting at least one other region 101a from among the said semiconductor regions 101a, 101b.

It is therefore possible to adjust the height of one cavity 150b or portion of cavity which may be subsequently formed between the given region 101b of the substrate 100 and a membrane, and to make the height $H_{12}$ of this cavity 150b higher than the height $H_{11}$ of another portion of cavity or other cavity 150a subsequently formed between the region 101a of the substrate 100 and a membrane.

This membrane 140 can then be added in particular by bonding onto the insulating posts 104a, 104b, 104c in similar manner to the one previously described.

Figure 6A:
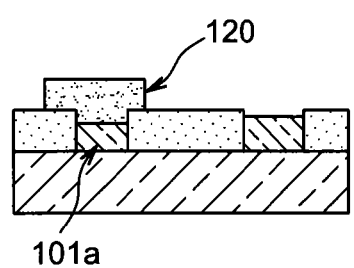

As a variant (FIGS. 6A-6B), after the step described previously in connection with FIG. 3B, selective epitaxial growth of semiconductor material can subsequently be performed on at least one given region 101b from among the said semiconductor regions 101a, 101b. This addition of semiconductor material is conducted through a mask 120 protecting at least one another region 101a from among the said semiconductor regions 101a, 101b (FIG. 6A).

Figure 6B:
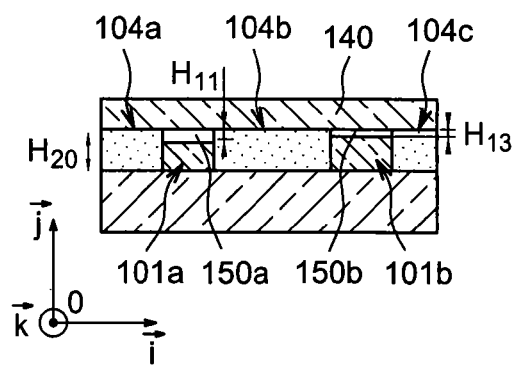

It is thus possible to adjust the height of a cavity 150b or portion of cavity subsequently formed between the given region 101b of the substrate 100 and a membrane 140, and to make the height $H_{13}$ of this cavity 150b lower than the height $H_{11}$ of another portion of cavity or other cavity 150a formed between the other region 101a of the substrate 100 and the membrane 140 (FIG. 6B).

A further example of a method according to the invention is illustrated in FIGS. 4A-4E.

The starting material in this example of method may be a semiconductor substrate 100 on which insulating regions 302a, 302b are formed. These insulating regions 302a, 302b may be in $SiO_2$ for example respectively coated with oxidation masking regions 303a, 303b in $Si_3N_4$ for example (FIG. 4A).

Anisotropic etching is then carried out e.g. of RIE or DRIE type on one surface of the substrate 100 called <<upper surface>> through the masking regions 303a, 303b stacked on the insulating regions 302a, 302b respectively.

This etching is performed so as to form trenches 305a, 305b, 305c in the substrates, blocks 301a, 301b of the substrate 100 being arranged either side of the trenches (FIG. 4B).

The depth of the trenches 305a, 305b, 305c is adjusted in relation to the depth it is desired to provide for insulating posts intended to be subsequently formed.

Thereafter, thermal oxidation is carried out of the semiconductor material of the substrate 100 to fill the trenches with insulating material.

The trenches filled with insulating material and oxidized regions of the substrate located in the continuation of these trenches form insulating posts 104a, 104b, 104c of which a bottom part is buried in the substrate 100 and located on one side of the upper surface of the substrate, the top part of the posts 104a, 104b, 104c projecting from the upper surface of the substrate 100. The thickness of the oxide created may be such that the upper surface of the created oxide lies flush or substantially flush with the level of the oxidizing masks 303a, 303b. By substantially flush is meant for example a difference in level of no more than 10 nm or 50 nm.

If the oxidization masking regions 303a, 303b are in $Si_3N_4$ for example, after oxidization (FIG. 4C) these regions can be converted to $SiO_xN_y$. The behaviour of these regions in $SiO_xN_y$ is advantageously similar to the behaviour of $SiO_2$ during a subsequent planarization step using CMP for example.

The oxidation masking regions 303a, 303b may have been chosen to have an initial thickness that is sufficiently narrow e.g. in the order of 100 nm, so that they can be converted by oxidization, and in particular so that they can be converted to $SiO_xN_y$ if these regions were initially in $Si_3N_4$.

Planarization e.g. using chemical mechanical polishing (CMP) is then carried out to remove excess thicknesses of insulating material. After this removal, a substrate 100 is obtained which, on its upper surface, comprises semiconductor regions 101a, 101b, and insulating posts 104a, 104b, 104c arranged either side of these semiconductor regions 101a, 101b, and arranged so as to have a bottom part buried in the substrate 100 and is therefore surrounded by the semiconductor material of the substrate 100 (FIG. 4E).

It is then possible to implement a method such as previously described in connection with FIGS. 2C-2E, to obtain a device with one or more cavities closed by a membrane supported by the insulating posts 104a, 104b, 104c.

In FIGS. 5A-5D an overhead view is given of different arrangements of insulating posts 104a, 104b, 104c obtained with one or other of the previously described methodes and intended to support the membrane 140.

Figure 5A:
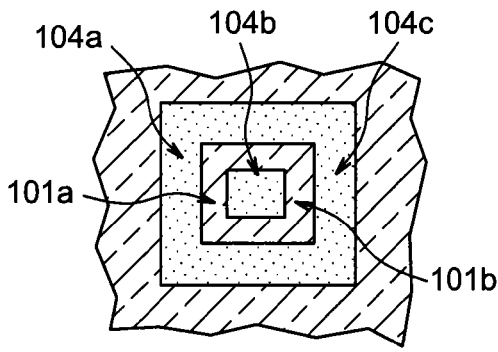
FIGS. 5A-5D illustrate different arrangements of insulating posts formed during a method according to the invention and intended to carry a suspended element.

In FIG. 5A, the posts 104a, 104b are contiguous with a region 101a of the upper surface of the substrate 100, whilst the posts 104b, 104c are contiguous with another region 101b of the upper surface of the substrate 100, the regions 101a and 101b being entirely surrounded by the insulating posts 104a, 104c.

With said arrangement it is possible to form a closed cavity delimited between the insulating posts 104a, 104b, 104c, the substrate 100 and the membrane 140.

Figure 5B:
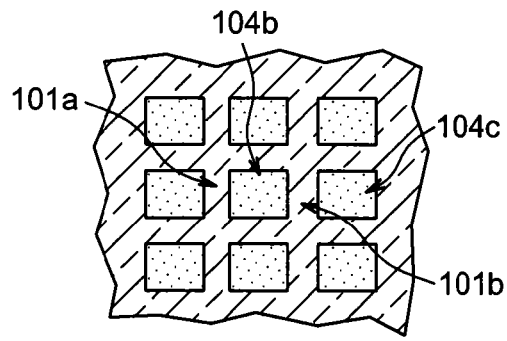

In FIG. 5B the insulating posts 104a, 104b, 104c are part of an arrangement in the form of an array.

With said arrangement it is possible to form open cavities.

Figure 5C:
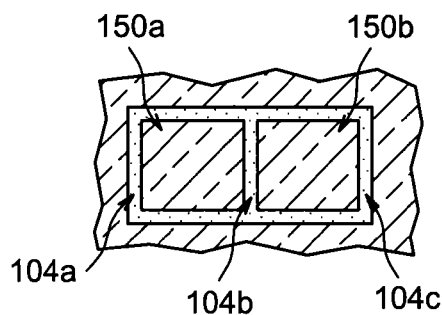

In FIG. 5C the posts 104a, 104b form a first cavity 150a, whilst the posts 104c, 104b form a second cavity 150a, the first cavity 150a and the second cavity 150b being closed and separated from each other by the post 104b.

Figure 5D:
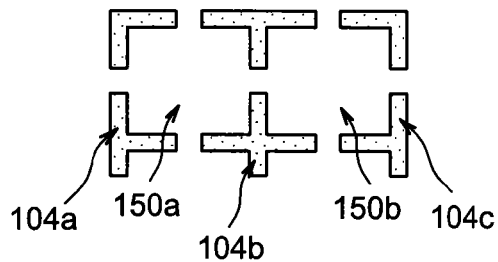

In FIG. 5D the posts 104a, 104b are arranged around a first cavity 150a, whilst the posts 104c, 104b are arranged around a second cavity 150b, the first cavity 150a and the second cavity 150b being open and communicating with each other.

The invention claimed is:

1. A method for producing a device including plural gaps of different height defined between a substrate in at least one given semiconductor material and a suspended element resting on a top of at least one post projecting from the substrate and electrically insulating the suspended element from the substrate, the method comprising:

a) forming one or more posts contiguous with one or more regions of an upper surface of a substrate in the at least one given semiconductor material;

b) modifying, by at least one etching and/or at least one addition of semiconductor material, a distance between at least one given region from among the regions of the upper surface and the top of at least one of the posts contiguous with the given region, the addition of semiconductor material and/or etching being conducted through a mask protecting at least one other region from among the regions of the upper surface of the substrate, the posts after the modifying b) including at least one part located in the substrate and surrounded by the at least one given semiconductor material; and c) forming a suspended element on the top of the at least one post.

2. The method according to claim 1, wherein the given region is partly or entirely surrounded by one or more of the posts.

3. The method according to claim 1, wherein the at least one post is arranged between two of the regions.

4. The method according to claim 1, wherein the posts are regularly distributed and arranged in an array.

5. The method according to claim 1, wherein the a) forming the one or more posts comprising:
   etching the upper surface of the substrate to form semiconductor blocks;
   forming the one or more posts contiguous with the semiconductor blocks.

6. The method according to claim 5, the a) forming the one or more posts further comprising:
   conformal deposition of insulating material on and around the semiconductor blocks;
   removal of insulating material in a region located above the semiconductor blocks;
   and the b) modifying comprising etching of all or part of the semiconductor blocks to form the regions.

7. The method according to claim 6, wherein the a) forming of the one or more posts further comprising:
   etching the upper surface of the substrate to form semiconductor blocks, the semiconductor blocks being covered by an oxidation mask;
   oxidizing the given semiconductor material of the substrate.

8. The method according to claim 1, wherein the a) forming the one or more posts comprising etching of an insulating layer resting on the substrate, to define insulating posts resting on the substrate.

9. The method according to claim 1, the substrate forming a first electrode or comprising a first electrode, the suspended element forming a second electrode or comprising a second electrode.

10. The method according to claim 1, the device being a NEMS/MEMS.

11. The method according to claim 1, the device being a cMUT transducer.

12. The method according to claim 1, wherein the c) forming to form the suspended element comprising transfer by direct bonding of a membrane onto the posts.

13. The method according to claim 12, wherein the membrane is thinned after the transfer.

14. The method according to claim 1, wherein the addition of material comprises epitaxial growth of semiconductor material.

* * * * *